United States Patent
Park

(10) Patent No.: US 7,663,951 B2
(45) Date of Patent: Feb. 16, 2010

(54) SEMICONDUCTOR MEMORY APPARATUS

(75) Inventor: Mun-Phil Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 117 days.

(21) Appl. No.: 11/647,393

(22) Filed: Dec. 29, 2006

(65) Prior Publication Data

US 2007/0183235 A1 Aug. 9, 2007

(30) Foreign Application Priority Data

Feb. 7, 2006 (KR) ...................... 10-2006-0011786

(51) Int. Cl.
*G11C 7/00* (2006.01)

(52) U.S. Cl. .................. 365/203; 365/230.03; 365/207; 365/189.18; 365/189.19

(58) Field of Classification Search ................. 365/203, 365/230.03, 207, 189.18, 189.19
See application file for complete search history.

(56) References Cited

U.S. PATENT DOCUMENTS

| | | | |
|---|---|---|---|
| 6,065,092 A * | 5/2000 | Roy ............................... 711/5 |
| 6,141,275 A | 10/2000 | Tsai et al. |
| 6,256,245 B1 * | 7/2001 | Kwak .......................... 365/203 |
| 6,314,042 B1 * | 11/2001 | Tomishima et al. ..... 365/230.03 |
| 7,061,817 B2 | 6/2006 | Raad et al. |
| 2001/0033522 A1 * | 10/2001 | Toda ....................... 365/230.03 |
| 2002/0031006 A1 * | 3/2002 | Arimoto et al. ............. 365/148 |
| 2002/0131316 A1 * | 9/2002 | Noh ....................... 365/230.03 |
| 2006/0018168 A1 * | 1/2006 | Kim ........................... 365/203 |
| 2006/0023536 A1 * | 2/2006 | Cho ........................... 365/206 |
| 2006/0120182 A1 | 6/2006 | Lee et al. |

FOREIGN PATENT DOCUMENTS

| JP | 2006134469 | 5/2006 |
|---|---|---|
| KR | 1020050106867 | 11/2005 |

* cited by examiner

*Primary Examiner*—Thong Q Le
(74) *Attorney, Agent, or Firm*—Venable LLP; Jeffri A. Kaminski

(57) ABSTRACT

A semiconductor memory apparatus includes a main bank configured to combine a first sub bank and a second sub bank. A center bitline sense amplifier array is arranged in a region where the first sub bank meets the second sub bank. A first precharge section is arranged above the first sub bank and a second precharge section is arranged below the second sub bank. The first precharge section precharges local input/output lines of the first sub bank and the second sub bank and the second precharge section precharges the local input/output lines.

13 Claims, 6 Drawing Sheets

SEMICONDUCTOR MEMORY APPARATUS

BACKGROUND OF THE INVENTION

1. Technical Field

The present invention relates to a semiconductor memory apparatus, and more particularly, to a semiconductor memory apparatus, capable of reducing the precharge time of local input/output lines LIO.

2. Related Art

Due to the recent increase in the density of high-speed dynamic random access memories (DRAM), there have been limitations to the package size used in a plurality of product groups (e.g., mobile and graphic product groups). In order to overcome the limitations, the structure of the DRAM has been implemented in various forms. One of the structures, which have recently been used for high-speed and high-density DRAMs, is a structure in which banks are combined in the direction that a row address increases so as to form one bank.

Hereinafter, a conventional semiconductor memory apparatus will be described with reference to FIGS. 1 and 2.

Referring to FIG. 1, a conventional semiconductor memory apparatus includes a first sub bank 110, a second sub bank 130, a first precharge section 150, a second precharge section 170 and a center bitline sense amplifier array 190.

The first precharge section 150 is arranged above the first sub bank 110 and precharges local input/output lines LIO of the first sub bank 110 and the second sub bank 130. The second precharge section 170 is arranged below the second sub bank 130 and precharges the local input/output lines LIO of the first sub bank 110 and the second sub bank 130. The center bitline sense amplifier array 190 is arranged in the area where the first sub bank 110 and the second sub bank 130 are connected each other.

The first sub bank 110 is arranged above the center bitline sense amplifier array 190. The second sub bank 130 is arranged below the center bitline sense amplifier array 190.

The first precharge section 150 includes a plurality of precharge control sections 150-1 to 150-N.

The second precharge section 170 includes a plurality of precharge control sections 170-1 to 170-N.

Generally, cell data selected by an external address is amplified by a bitline sense amplifier (BLSA). The amplified data is output to an input/output terminal by a column decoder through a global input/output line GIO.

Generally, the semiconductor memory has a bank structure including the first sub bank 110 and the second sub bank 130. The first sub bank 110 and the second sub bank 130 are connected in the direction in which the row address increases. A word line WL is simultaneously activated in the first sub bank 110 and the second sub bank 130. Due to the bank structure, there is an increase in the length of the local input/output line LIO(UP) arranged in the direction in which the row address increases. Therefore, there is a problem in that the time to precharge local input/output lines LIO(UP) and LIO(DOWN) by means of the plurality of precharge control sections 150-1 to 150-N and the plurality of precharge control sections 170-1 to 170-N increases.

Referring to FIG. 2, when a read command READ or a write command WRITE is applied, a corresponding column address selection signal YI is enable. When the column address selection signal YI is enabled, data is input to or output from the bitline sense amplifier (BLSA) through the local input/output lines LIO. When a precharge signal LIO_PCG is at a logic high level, the local input/output lines LIO are precharged.

If the local input/output line LIO becomes long, the load of the local input/output lines LIO increases due to high resistance or capacitance, resulting in slow precharging. Therefore, potential regions A, A-1, B, and B-1, where the local input/output lines LIO are precharged to a precharge voltage level Vpcg, are temporarily delayed. Accordingly, CAS to CAS command delay (tCCD) or internal WRITE to READ command delay (tWTR), which are characteristic to a DRAM, may deteriorate, thereby causing high speed operations to fail or operations which do not follow a predetermined specification to be performed.

Further, if a read operation is performed when local input/output line LIO is not sufficiently precharged, erroneous data may be amplified in the input/output sense amplifier, which causes the DRAM operation to fail. Therefore, after the read operation or the write operation is performed, the local input/output line LIO should be precharged as soon as possible to ensure stable DRAM operation.

SUMMARY OF THE INVENTION

Embodiments of the present invention provides a semiconductor memory apparatus that is capable of reducing a precharge time of local input/output lines by adding a precharge control section to the coupling portion of the bank structure in which two sub banks are combined.

According to a first embodiment of the present invention, a semiconductor memory apparatus includes a main bank having a first sub bank and a second sub bank, a center bitline sense amplifier array, a first precharge section and a second precharge section. The first sub bank and the second sub bank are combined as the main bank. The center bitline sense amplifier array is arranged in a region where the first sub bank meets the second sub bank. The first precharge section is arranged above the first sub bank and precharges local input/output lines of the first sub bank and the second sub bank. The second precharge section is arranged in the center bitline sense amplifier array and precharges the local input/output lines.

According to the first embodiment of the present invention, the semiconductor memory apparatus may further include a third precharge section and a delay section. The third precharge section is arranged below the second sub bank and precharges the local input/output lines. The delay section delays input timings of a precharge signal inputted to at least one of the first precharge section, the second precharge section, and the third precharge section.

According to a second embodiment of the present invention, a semiconductor memory apparatus includes a main bank having a first sub bank and a second sub bank, a center bitline sense amplifier array, a first precharge section and a second precharge section. The first sub bank and the second sub bank are combined as the main bank. The center bitline sense amplifier array is arranged in a region where the first sub bank meets the second sub bank. The first precharge section is arranged below the second sub bank and precharges local input/output lines of the first sub bank and the second sub bank. The second precharge section is arranged in the center bitline sense amplifier array and precharges the local input/output lines.

According to second embodiment of the present invention, the semiconductor memory apparatus may further include a delay section. The delay section delays input timings of a precharge signal inputted to at least one of the first precharge section and the second precharge section.

DESCRIPTION OF EXEMPLARY EMBODIMENTS

Hereinafter, an exemplary embodiment of the present invention will be described in detail with reference to the accompanying drawings.

Figure 1:
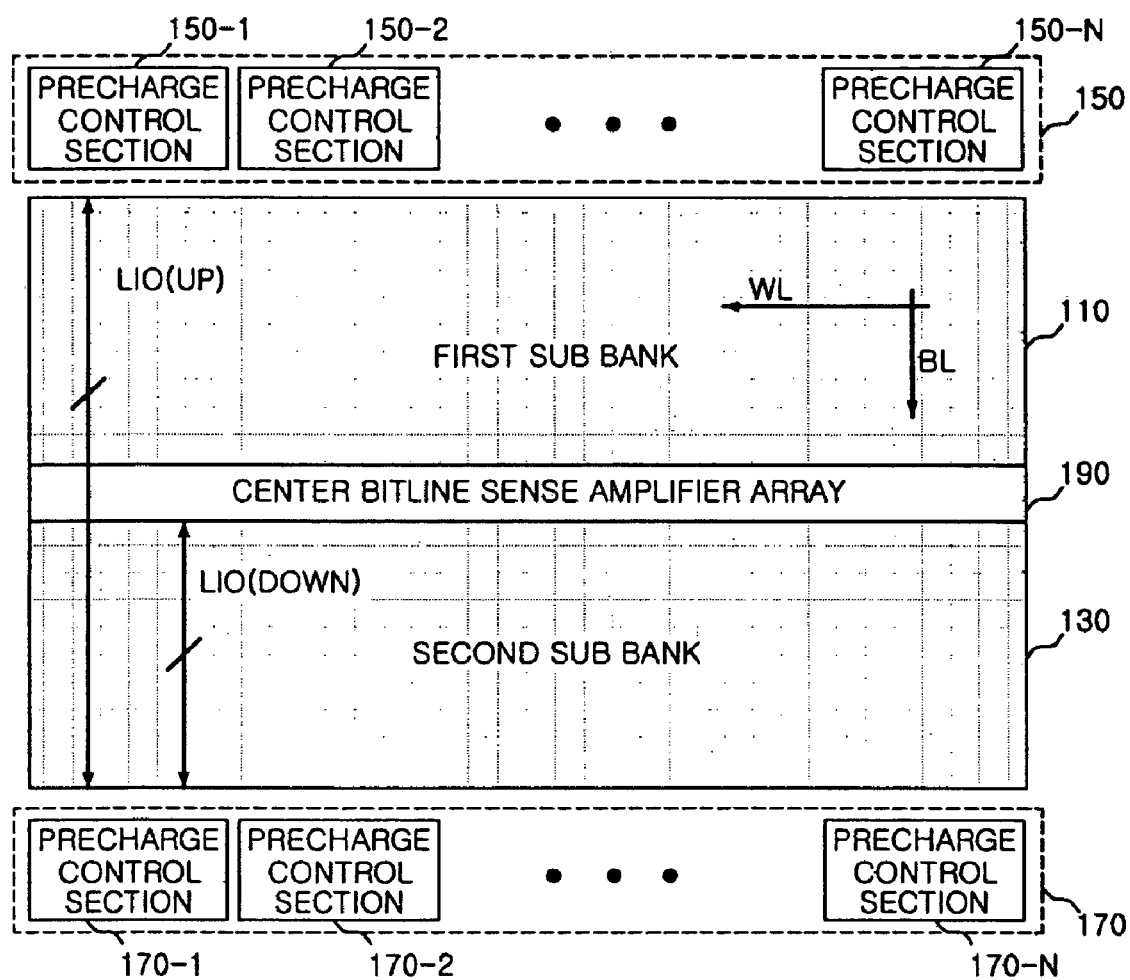
FIG. 1 is a diagram of a conventional semiconductor memory apparatus.
Figure 2:
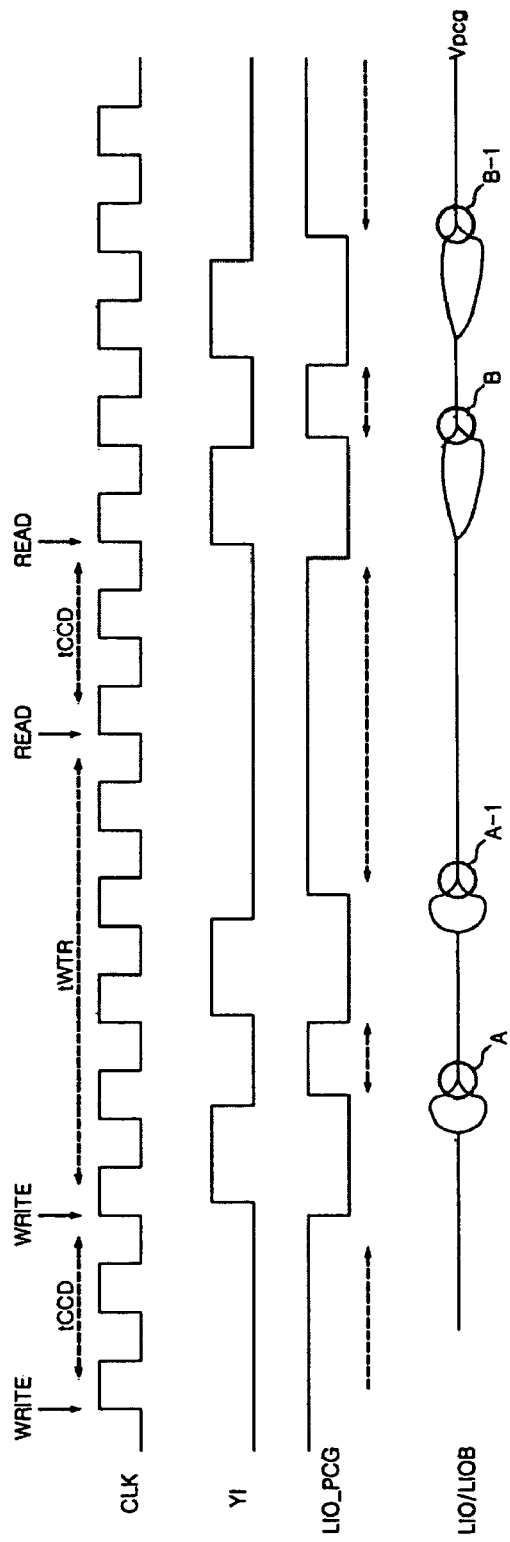
FIG. 2 is a precharge timing chart of conventional local input/output lines.
Figure 3:
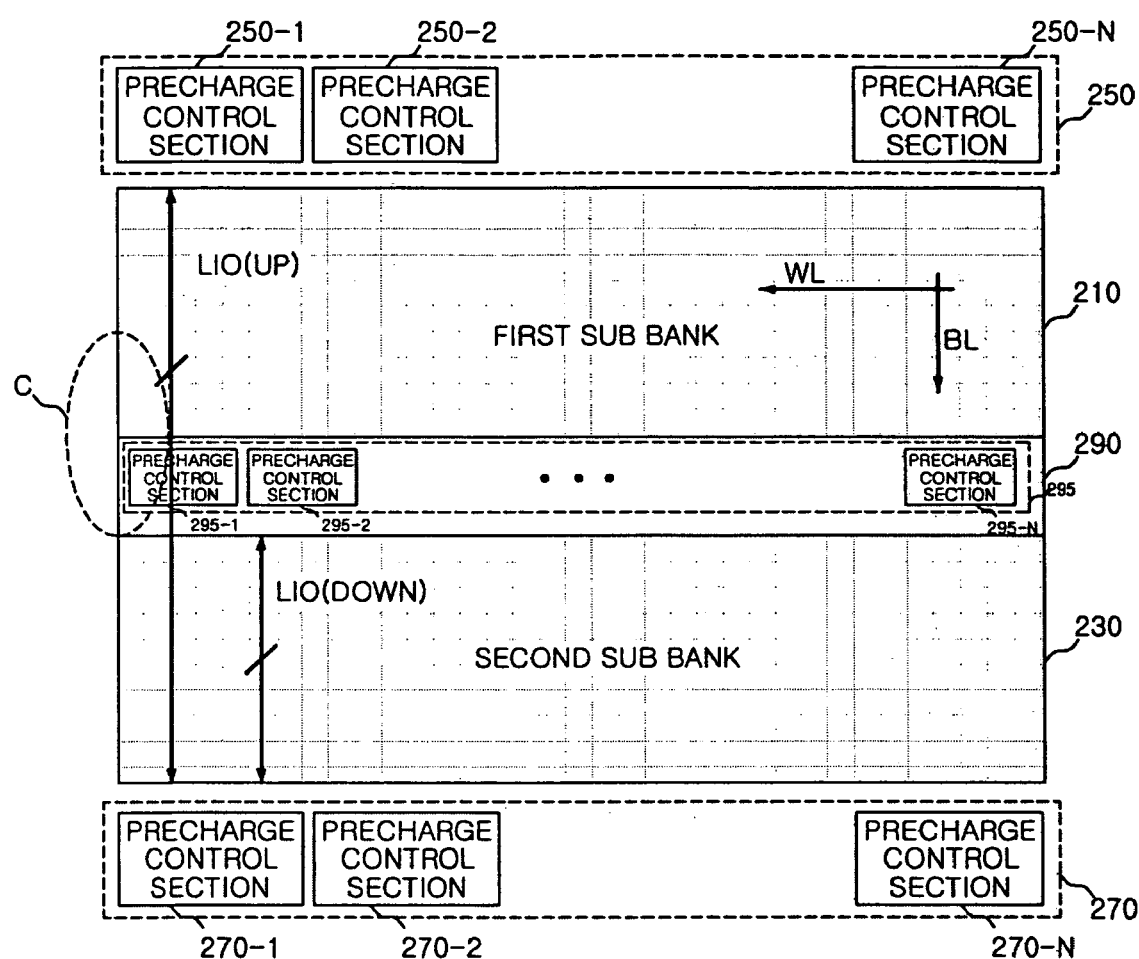
FIG. 3 is a diagram of a semiconductor memory apparatus according to an embodiment of the present invention.

Referring to FIG. 3, a semiconductor memory apparatus according to an embodiment of the present invention includes a first sub bank 210, a second sub bank 230, a center bitline sense amplifier array 290, a first precharge section 250, a second precharge section 270, and a third precharge section 295.

The center bitline sense amplifier array 290 is arranged in a region where the first sub bank 210 meets the second sub bank 230. The first precharge section 250 is arranged above the first sub bank 210 and precharges local input/output lines LIO of the first sub bank 210 and the second sub bank 230. The second precharge section 270 is arranged below the second sub bank 230 and precharges the local input/output lines LIO. The third precharge section 295 is arranged in the center bitline sense amplifier array 290 and precharges the local input/output lines LIO.

The first sub bank 210 is arranged above the center bitline sense amplifier array 290 and the second sub bank 230 is arranged below the center bitline sense amplifier array 290.

The first precharge section 250 includes a plurality of precharge control sections 250-1 to 250-N.

The second precharge section 270 includes a plurality of precharge control sections 270-1 to 270-N.

The third precharge section 295 includes a plurality of precharge control sections 295-1 to 295-N.

In a bank structure including the first sub bank 210, the second sub bank 230, and the center bitline sense amplifier array 290, a region of the center bitline sense amplifier array 290 is larger than a region of a bitline sense amplifier array of the first sub bank 210 and a region of a bitline sense amplifier array of the second sub bank 230. Therefore, if the precharge control sections 295-1 to 295-N are inserted in the center bitline sense amplifier array 290 such that the long local input/output lines LIO(UP) and LIO(DOWN) are precharged in the middle of the long local input/output lines LIO(UP), the precharge time can be reduced.

Figure 4:
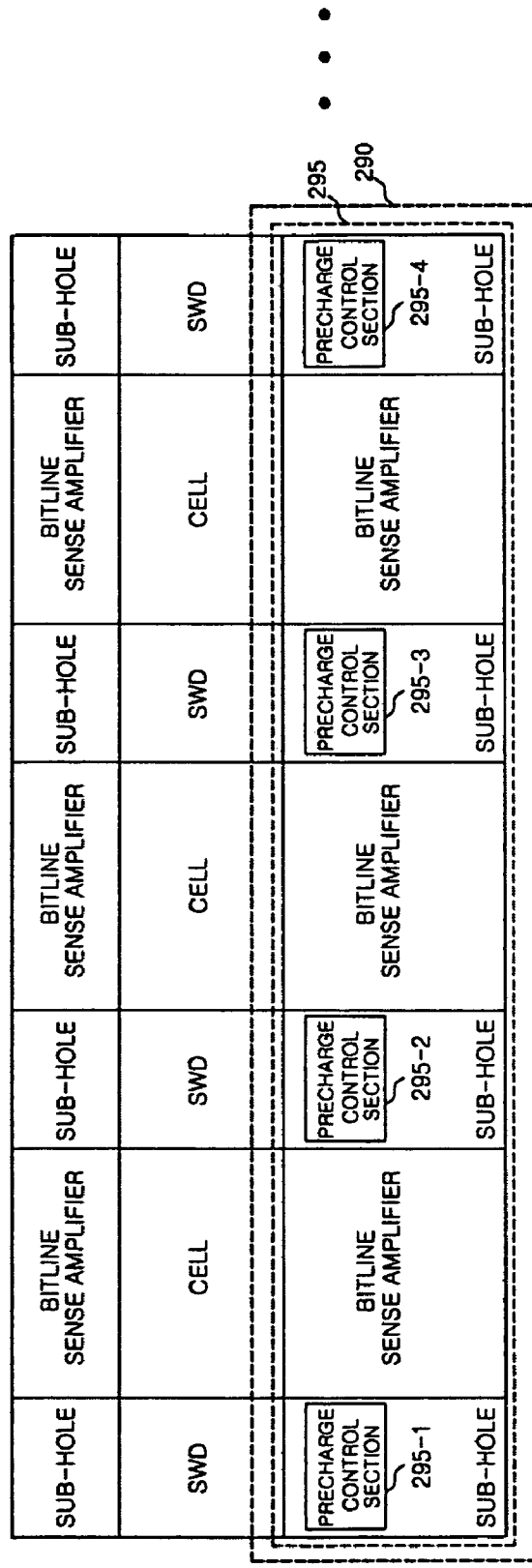
FIG. 4 is an enlarged diagram of the C region of the semiconductor memory apparatus shown in FIG. 3.

Referring to FIG. 4, the region of the center bitline sense amplifier array 290 includes a plurality of sub-hole regions and a plurality of bitline sense amplifier regions.

In the semiconductor memory apparatus according to the embodiment of the present invention, the first precharge section 250 is arranged above the first sub bank 210, the second precharge section 270 is arranged below the second sub bank 230, and the precharge control sections 295-1 to 295-N included in the third precharge section 295 are arranged in the sub-holes of the center bitline sense amplifier array 290.

The first precharge section 250 arranged above the first sub bank 210 and the second precharge section 270 arranged below the second sub bank 230 have small spatial limitations. Therefore, a MOS transistor which has large channel length and channel width may be used to precharge the local input/output lines LIO.

Since the precharge control sections 295-1 to 295-N arranged in the respective sub-holes of the center bitline sense amplifier array 290 have very small layout spaces, an NMOS transistor having channel length and channel width smaller than those of the MOS transistor used in the first precharge section 250 and the second precharge section 270 may be used to precharge the local input/output lines LIO. Further, the precharge control sections 295-1 to 295-N corresponding to the number of local input/output lines LIO are arranged in the sub-holes of the center bitline sense amplifier array 290.

The region of the center bitline sense amplifier array 290 sharing the local input/output lines LIO is larger than those of the bitline sense amplifier array. The sub-holes included in the center bitline sense amplifier array 290 are larger than the sub-holes included in the first sub bank 210 and the second sub bank 230. Further, each sub-hole includes the individual precharge control sections 295-1 to 295-N so as to smoothly precharge the local input/output lines LIO.

As described above, the sub hole is a space that remains after a sub word line driver array block (SWD), in which a word line driver of a cell mat in the dynamic random access memory (DRAM) is disposed, and a bitline sense amplifier array, which amplifies bitline data, are arranged in an X-axis direction and a Y-axis direction. A driver which drives a sub word line may be arranged in the sub hole.

Figure 5A:
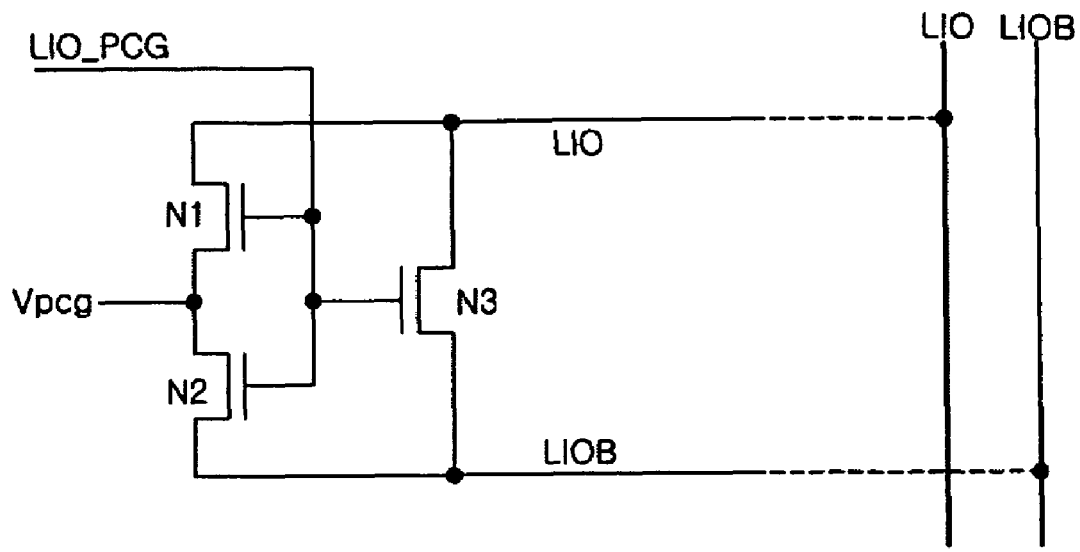
FIG. 5A is a circuit diagram of an example of the precharge control section shown in FIG. 3.

Referring to FIG. 5A, the precharge control section according to an exemplary embodiment may include a first NMOS transistor N1, a second NMOS transistor N2 and a third NMOS transistor N3.

The first NMOS transistor N1 has a gate terminal that receives a precharge signal LIO_PCG, a source terminal that is coupled to the local input/output line LIO, and a drain terminal that is coupled to an input terminal of a precharge voltage Vpcg. The second NMOS transistor N2 has a gate terminal that receives the precharge signal LIO_PCG, a source terminal that is coupled to the input terminal of the precharge voltage Vpcg, and a drain terminal that is coupled to a local input/output inversion line LIOB. The third NMOS transistor N3 has a gate terminal that receives the precharge signal LIO_PCG, a source terminal that is coupled to the local input/output line LIO, and a drain terminal that is coupled to the local input/output inversion line LIOB.

The above-described example of the precharge control section is used when a potential difference between the precharge voltage Vpcg and the precharge signal LIO_PCG that enables or disables the precharge control sections 250-1 to 250-N, 270-1 to 270-N, and 295-1 to 295-N is larger than a threshold voltage Vt.

Figure 5B:
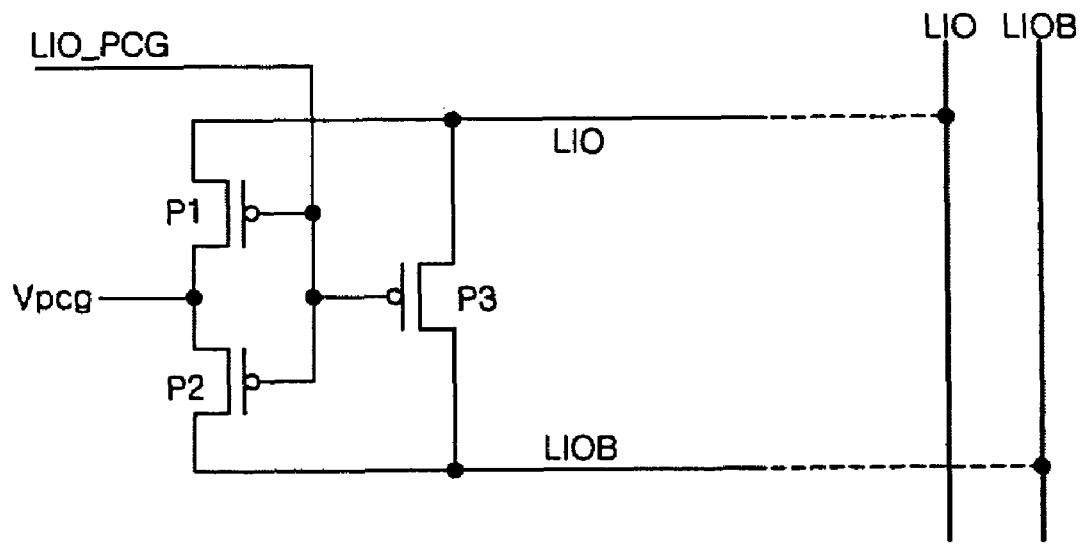
FIG. 5B is a circuit diagram of another example of the precharge control section shown in FIG. 3.

Referring to FIG. 5B, the precharge control section according to another exemplary embodiment may include a first PMOS transistor P1, a second PMOS transistor P2 and a third PMOS transistor P3.

The first PMOS transistor P1 has a gate terminal that receives a precharge signal LIO_PCG, a source terminal that is connected to the local input/output line LIO, and a drain terminal that is connected to an input terminal of a precharge voltage Vpcg. The second PMOS transistor P2 has a gate terminal that receives the precharge signal LIO_PCG, a source terminal that is connected to the input terminal of the precharge voltage Vpcg, and a drain terminal that is connected to a local input/output inversion line LIOB. The third PMOS transistor P3 has a gate terminal that receives the precharge signal LIO_PCG, a source terminal that is connected to the local input/output line LIO, and a drain terminal that is connected to the local input/output inversion lines LIOB.

The above-described example of the precharge control section is used when a potential difference between the precharge voltage Vpcg and the precharge signal LIO_PCG that enables or disables the precharge control sections 250-1 to 250-N, 270-1 to 270-N, and 295-1 to 295-N is smaller than the threshold voltage Vt.

Figure 5C:
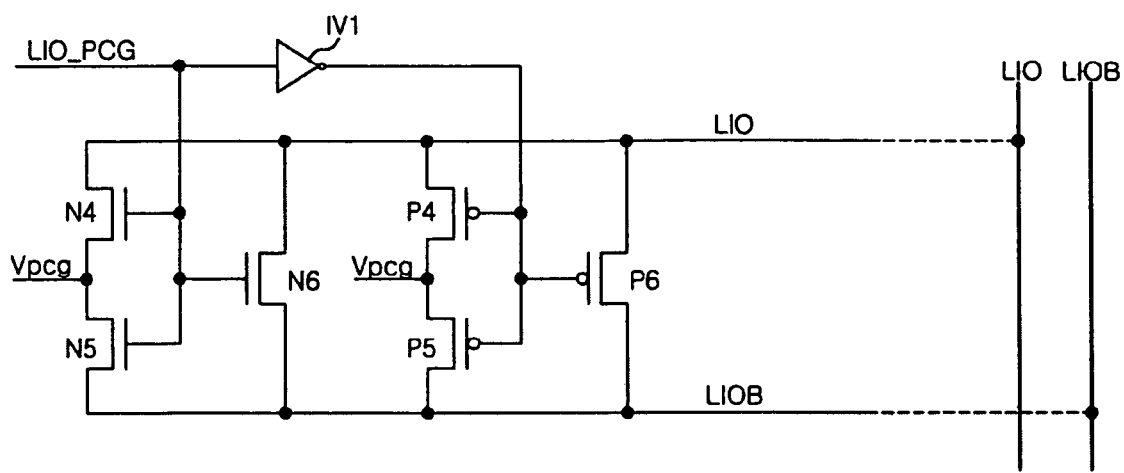
FIG. 5C is a circuit diagram of a further example of the precharge control section shown in FIG. 3.

Referring to FIG. 5C, the precharge control section according to a further exemplary embodiment includes a fourth NMOS transistor N4, a fifth NMOS transistor N5, a sixth NMOS transistor N6, an inverter IV1, a fourth PMOS transistor P4, a fifth PMOS transistor P5 and a sixth PMOS transistor P6.

The fourth NMOS transistor N4 has a gate terminal that receives a precharge signal LIO_PCG, a source terminal that is connected to a local input/output line LIO, and a drain terminal that is connected to an input terminal of a precharge voltage Vpcg. The fifth NMOS transistor N5 has a gate terminal that receives the precharge signal LIO_PCG, a source terminal that is connected to the input terminal of the precharge voltage Vpcg, and a drain terminal that is connected to a local input/output inversion line LIOB. The sixth NMOS transistor N6 has a gate terminal that receives the precharge signal LIO_PCG, a source terminal that is connected to the local input/output line LIO, and a drain terminal that is connected to the local input/output inversion line LIOB. The inverter IV1 inverts the precharge signal LIO_PCG. The fourth PMOS transistor P4 has a gate terminal that is connected to the inverter IV1, a source terminal that is connected to the local input/output line LIO, and a drain terminal that is connected to the input terminal of the precharge voltage Vpcg. The fifth PMOS transistor P5 has a gate terminal that is connected to the inverter IV1, a source terminal that is connected to the input terminal of the precharge voltage Vpcg, and a drain terminal that is connected to the local input/output inversion line LIOB. The sixth PMOS transistor P6 has a gate terminal that is connected to the inverter IV1, a source terminal that is connected to the local input/output line LIO, and a drain terminal that is connected to the local input/output inversion line LIOB.

The above-described example of the precharge control section is used when a potential difference between the precharge voltage Vpcg and the precharge signal LIO_PCG is larger than the threshold voltage Vt. Further, the above-described example of the precharge control section is used to reduce a coupling effect between the precharge signal LIO_PCG and the precharge voltage Vpcg, which is generated when only an NMOS transistor is used.

Figure 6:
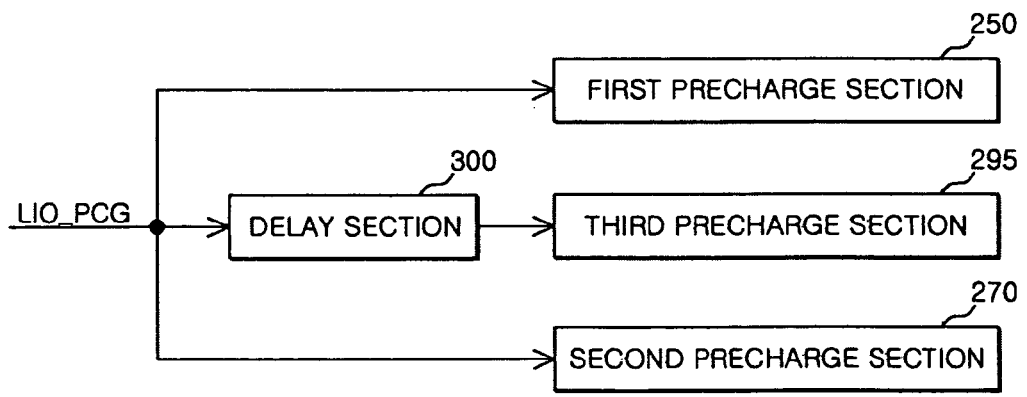
FIG. 6 is a block diagram of a transmission path of a precharge signal.

Referring to FIG. 6, since the transmission path of the precharge signal LIO_PCG varies based on the location of the signal generation unit which generates the precharge signal LIO_PCG, the precharge signal LIO_PCG is input to the first precharge section 250, the second precharge section 270, and the third precharge section 295 at different timings. In order to make the precharge signal LIO_PCG input the precharge sections 250, 270, and 295 at the same time, the signal having a short transmission path should be delayed. Under such an arrangement, the first precharge section 250, the second precharge section 270, and the third precharge section 295 are enabled at the same time, thereby securing stability of semiconductor memory operation.

In the exemplary embodiment illustrated in FIG. 6, the transmission path of the precharge signal LIO_PCG to the first precharge section 250 is the same length as the transmission path of the precharge signal LIO_PCG to the second precharge section 270, and the transmission path of the precharge signal LIO_PCG to the third precharge section 295 is shorter than those to the first precharge section 250 and the second precharge section 270. In this case, in order to input the precharge signal LIO_PCG to the first precharge section 250, the second precharge section 270, and the third precharge section 295 at the same time, a delay section 300 is provided on the transmission path through which the precharge signal LIO_PCG is input to the third precharge section 295.

As described above, in the semiconductor memory apparatus according to the embodiment of the present invention, the precharge time of the local input/output lines LIO of the memory having a bank structure in which two sub banks are combined can be reduced by adding the precharge control sections 295-1 to 295-N to the center bitline sense amplifier array 290.

It will be apparent to those skilled in the art that various modifications may be made without departing from the scope and spirit of the present invention. Therefore, it should be understood that the above embodiments are not limitative, but illustrative in all respects. The scope of the present invention is defined by the appended claims rather than by the description preceding them, and therefore all changes and modifications that fall within the metes and bounds of the claims, or equivalents of such metes and bounds are therefore intended to be embraced by the claims.

In the semiconductor memory apparatus according to an embodiment of the present invention, the precharge time of the local input/output lines LIO of a high-speed memory having a bank structure in which two sub banks are combined can be reduced. Therefore, it is possible to prevent memory characteristics from deteriorating by reducing the precharge time.

What is claimed is:

1. A semiconductor memory apparatus comprising:
   a main bank configured to combine a first sub bank and a second sub bank;
   a center bitline sense amplifier array arranged in a region where the first sub bank meets the second sub bank;
   a first precharge section arranged above the first sub bank, wherein the first precharge section is configured to precharge local input/output lines of the first sub bank and the second sub bank; and
   a second precharge section arranged in the center bitline sense amplifier array, wherein the second precharge section is configured to precharge the local input/output lines.

2. The semiconductor memory apparatus of claim 1, further comprising:
   a third precharge section arranged below the second sub bank,
   wherein the third precharge section is configured to precharge the local input/output lines.

3. The semiconductor memory apparatus of claim 1, wherein the first sub bank is arranged above the center bitline sense amplifier array.

4. The semiconductor memory apparatus of claim 1, wherein the second sub bank is arranged below the center bitline sense amplifier array.

5. The semiconductor memory apparatus of claim 1, wherein a region of the center bitline sense amplifier array includes a sub-hole region and a bitline sense amplifier region.

6. The semiconductor memory apparatus of claim 2 further comprising a delay section configured to delay input timings of a precharge signal inputted to at least one of the first precharge section, the second precharge section, and the third precharge section.

7. The semiconductor memory apparatus of claim 5, wherein the second precharge section comprises a precharge control section arranged in the sub-hole region.

8. A semiconductor memory apparatus comprising:
a main bank configured to combine a first sub bank and a second sub bank;
a center bitline sense amplifier array arranged in a region where the first sub bank meets the second sub bank;
a first precharge section arranged below the second sub bank, wherein the first precharge section is configured to precharge local input/output lines of the first sub bank and the second sub bank; and
a second precharge section arranged in the center bitline sense amplifier array, wherein the second precharge section is configured to precharge the local input/output lines.

9. The semiconductor memory apparatus of claim 8, wherein the first sub bank is arranged above the center bitline sense amplifier array.

10. The semiconductor memory apparatus of claim 8, wherein the second sub bank is arranged below the center bitline sense amplifier array.

11. The semiconductor memory apparatus of claim 8, wherein a region of the center bitline sense amplifier array includes a sub-hole region and a bitline sense amplifier region.

12. The semiconductor memory apparatus of claim 8, further comprising a delay section configured to delay input timings of a precharge signal inputted to at least one of the first precharge section and the second precharge section.

13. The semiconductor memory apparatus of claim 11, wherein the second precharge section comprises a precharge control section arranged in the sub-hole region.

* * * * *